(12) United States Patent
Chun et al.

(10) Patent No.: US 12,232,369 B2
(45) Date of Patent: Feb. 18, 2025

(54) DISPLAY APPARATUS INCLUDING OVERLAPPING OPENINGS

(71) Applicant: Samsung Display Co., Ltd., Yongin-si (KR)

(72) Inventors: Jiyun Chun, Yongin-si (KR); Kwanhee Lee, Yongin-si (KR); Sangmin Yi, Yongin-si (KR); Sangyeol Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 69 days.

(21) Appl. No.: 17/323,825

(22) Filed: May 18, 2021

(65) Prior Publication Data

US 2022/0020834 A1 Jan. 20, 2022

(30) Foreign Application Priority Data

Jul. 14, 2020 (KR) .................. 10-2020-0086889

(51) Int. Cl.
*H10K 59/12* (2023.01)
*H10K 50/84* (2023.01)
(Continued)

(52) U.S. Cl.
CPC ......... *H10K 59/124* (2023.02); *H10K 50/844* (2023.02); *H10K 50/858* (2023.02);
(Continued)

(58) Field of Classification Search
CPC ............. H01L 27/3246; H01L 27/3258; H01L 27/3227; H01L 27/3244; H01L 51/0097; H01L 51/5253; H01L 51/5275; H01L 51/5281; H01L 51/5237; H01L 51/5293; H01L 2251/5338; H01L 2251/558; H10K 50/844; H10K 50/858; H10K 50/86; H10K 50/84; H10K 50/868; H10K 59/124; H10K 59/122; H10K 59/60; H10K 59/12; H10K 77/111; H10K 2102/311; H10K 2102/351
See application file for complete search history.

(56) References Cited

U.S. PATENT DOCUMENTS 10,466,822 B2 11/2019 Kim et al.
10,777,620 B2 * 9/2020 Won .................. G06F 3/0446
(Continued)

FOREIGN PATENT DOCUMENTS

EP 3660821 A1 * 6/2020 .............. G09G 3/20
JP 2018-99811 A 6/2018
(Continued)

*Primary Examiner* — Ida M Soward
(74) *Attorney, Agent, or Firm* — Lewis Roca Rothgerber Christie LLP

(57) ABSTRACT

A display apparatus includes: a substrate; an insulating layer on the substrate and including a first opening; a plurality of first electrodes on the insulating layer, not overlapping the first opening, and spaced apart from each other; an emission layer on each of the plurality of first electrodes without overlapping the first opening; an intermediate layer including the emission layer; a second electrode on the intermediate layer; an encapsulation layer on the second electrode; and a polarization layer on the encapsulation layer and including a second opening overlapping the first opening.

17 Claims, 17 Drawing Sheets

(51) Int. Cl.
    *H10K 50/844*    (2023.01)
    *H10K 50/85*     (2023.01)
    *H10K 50/858*    (2023.01)
    *H10K 59/124*    (2023.01)
    *H10K 77/10*     (2023.01)
    *H10K 50/86*         (2023.01)
    *H10K 59/122*        (2023.01)
    *H10K 102/00*        (2023.01)

(52) U.S. Cl.
    CPC ............ *H10K 77/111* (2023.02); *H10K 50/86* (2023.02); *H10K 59/122* (2023.02); *H10K 2102/311* (2023.02)

(56) References Cited

U.S. PATENT DOCUMENTS

| | | | |
|---|---|---|---|
| 10,818,874 | B2 | 10/2020 | Park |
| 10,818,877 | B2 | 10/2020 | Hong et al. |
| 10,886,339 | B2* | 1/2021 | Won .................. G06F 3/0412 |
| 11,211,584 | B2 | 12/2021 | Lee et al. |
| 11,456,348 | B2* | 9/2022 | Bang .................. H10K 59/131 |
| 11,706,953 | B2* | 7/2023 | Chung ................ H10K 59/124 |
| | | | 257/40 |
| 12,052,885 | B2 | 7/2024 | Yim et al. |
| 2017/0170431 | A1* | 6/2017 | Im ...................... H01L 51/5271 |
| 2017/0237025 | A1* | 8/2017 | Choi .................. H10K 50/844 |
| | | | 257/40 |
| 2018/0053816 | A1* | 2/2018 | Choi .................. H10K 77/111 |
| 2018/0175323 | A1* | 6/2018 | Ahn .................... H10K 59/873 |
| 2018/0198067 | A1 | 7/2018 | Kim et al. |
| 2018/0226608 | A1* | 8/2018 | Nakagawa .......... H10K 59/873 |
| 2018/0309079 | A1* | 10/2018 | Matsumoto ........... H10K 71/00 |
| 2019/0019966 | A1* | 1/2019 | Jiang .................. H01L 51/5253 |
| 2019/0074478 | A1* | 3/2019 | Kwon ................. H10K 59/873 |
| 2019/0214601 | A1* | 7/2019 | Park .................. H10K 50/8445 |
| 2019/0267444 | A1* | 8/2019 | Moon ................. H01L 27/3258 |
| 2019/0326549 | A1* | 10/2019 | Kokame ............... H05B 33/06 |
| 2019/0384121 | A1* | 12/2019 | Nishiwaki ......... G02F 1/133528 |
| 2019/0393444 | A1* | 12/2019 | Nam ..................... G06F 1/1643 |
| 2020/0091256 | A1* | 3/2020 | Kim .................... H01L 51/5253 |
| 2020/0144344 | A1* | 5/2020 | Wang .................... H10K 71/00 |
| 2020/0144530 | A1 | 5/2020 | Kim et al. |
| 2020/0227487 | A1* | 7/2020 | Furuie .................. H10K 50/11 |
| 2020/0295310 | A1* | 9/2020 | Moon ................. H01L 51/5284 |
| 2020/0313101 | A1* | 10/2020 | Jung ................... H01L 27/3244 |
| 2020/0365667 | A1* | 11/2020 | Jo ......................... H10K 59/00 |
| 2020/0380893 | A1* | 12/2020 | Park .................... G06F 1/1652 |
| 2021/0013286 | A1* | 1/2021 | Yoon .................. H01L 27/3276 |
| 2021/0066410 | A1* | 3/2021 | Jo ........................ H10K 59/131 |
| 2021/0111230 | A1* | 4/2021 | Shin ..................... G06F 1/1641 |
| 2021/0175468 | A1* | 6/2021 | Lee ...................... H01L 27/323 |
| 2021/0210723 | A1* | 7/2021 | Han ................... H01L 27/3246 |
| 2021/0359051 | A1* | 11/2021 | Jin ......................... H10K 59/40 |
| 2021/0408182 | A1 | 12/2021 | Chung et al. |
| 2021/0408492 | A1* | 12/2021 | Ouyang ............... H10K 50/865 |

FOREIGN PATENT DOCUMENTS

| | | |
|---|---|---|
| KR | 10-0658758 B1 | 12/2006 |
| KR | 10-1590024 B1 | 2/2016 |
| KR | 10-2018-0005772 A | 1/2018 |
| KR | 10-2018-0017301 A | 2/2018 |
| KR | 10-2018-0046970 A | 5/2018 |
| KR | 10-2018-0063633 A | 6/2018 |
| KR | 10-2018-0083459 A | 7/2018 |
| KR | 10-2019-0132602 A | 11/2019 |
| KR | 10-2020-0013819 A | 2/2020 |
| KR | 10-2020-0039866 A | 4/2020 |
| KR | 10-2020-0050639 A | 5/2020 |
| KR | 10-2020-0051107 A | 5/2020 |
| WO | 2020/067611 A1 | 4/2020 |

* cited by examiner

DISPLAY APPARATUS INCLUDING OVERLAPPING OPENINGS

CROSS-REFERENCE TO RELATED APPLICATION

The present application claims priority to and the benefit of Korean Patent Application No. 10-2020-0086889, filed on Jul. 14, 2020, in the Korean Intellectual Property Office, the entire disclosure of which is incorporated herein by reference.

BACKGROUND

1. Field

Aspescts of one or more embodiments relate to a display apparatus including an opening.

2. Description of the Related Art

The various uses and applications of display apparatuses has become more diversified over time. Various functions for connecting to, linking to, or interacting with display apparatuses have been added while the area occupied by a display area in such display apparatuses has increased. As a method of adding various functions while expanding the display area, a display apparatus may have an opening formed inside the display area and a photographing device such as a camera is located at a position overlapping the opening.

The above information disclosed in this Background section is only for enhancement of understanding of the background and therefore the information discussed in this Background section does not necessarily constitute prior art.

SUMMARY

When forming an opening in a display area, a manufacturing process may be utilized to minimize or reduce a dead space (e.g., a non-display or bezel area) around the opening. Aspects of one or more embodiments include a display apparatus in which a dead space around an opening is minimized or reduced and defects that may otherwise occur in an opening forming process are minimized, eliminated, or reduced. However, this is merely an example, and the scope of embodiments according to the present disclosure are not limited thereto.

Additional aspects and characteristics will be set forth in part in the description which follows and, in part, will be more apparent from the description, or may be learned by practice of the presented embodiments of the disclosure.

According to one or more embodiments, a display apparatus includes a substrate, an insulating layer on the substrate and including a first opening, a plurality of first electrodes on the insulating layer, not overlapping the first opening, and apart from each other, an emission layer on each of the plurality of first electrodes without overlapping the first opening, an intermediate layer including the emission layer, a second electrode on the intermediate layer, an encapsulation layer on the second electrode, and a polarizing layer on the encapsulation layer and including a second opening overlapping the first opening.

According to some embodiments, the encapsulation layer may include a first trench overlapping the first opening and the second opening.

According to some embodiments, the encapsulation layer may include a glass material.

According to some embodiments, the display apparatus may further include a refractive index compensation layer between the first trench and the substrate.

According to some embodiments, a refractive index of the refractive index compensation layer may be greater than a refractive index of air and less than a refractive index of the encapsulation layer.

According to some embodiments, the refractive index compensation layer may include a silicon resin.

According to some embodiments, the encapsulation layer may include a first inorganic encapsulation layer, a second inorganic encapsulation layer, and an organic encapsulation layer between the first inorganic encapsulation layer and the second inorganic encapsulation layer.

According to some embodiments, the encapsulation layer may be continuously located in an area overlapping the first opening and the second opening, and on the plurality of first electrodes without interruption.

According to some embodiments, a thickness of an area of the organic encapsulation layer that overlaps the first opening and the second opening may be greater than a thickness of an area of the organic encapsulation layer that does not overlap the first opening and the second opening.

According to some embodiments, the insulating layer may include a multilayer films, and the first opening may be formed in at least one of the multilayer films.

According to some embodiments, the intermediate layer may include a first intermediate layer between the emission layer and the plurality of first electrodes, and a second intermediate layer between the emission layer and the second electrode. At least one of the first intermediate layer or the second intermediate layer may overlap the first opening and the second opening.

According to some embodiments, the second electrode may overlap the first opening and the second opening.

According to some embodiments, the display apparatus may further include a capping layer between the second electrode and the encapsulation layer, wherein the capping layer may overlap the first opening and the second opening.

According to some embodiments, the substrate may include a second trench overlapping the first opening and the second opening.

According to some embodiments, the display apparatus may further include a pixel defining layer surrounding the plurality of first electrodes, and a spacer located in a partial area on the pixel definition layer, wherein the spacer may surround the first opening.

According to some embodiments, the display apparatus may further include a cover layer including a transparent material on the polarizing layer.

According to some embodiments, the display apparatus may further include an adhesive layer between the polarizing layer and the cover layer.

According to one or more embodiments, a display apparatus includes a substrate, an insulating layer on the substrate, an encapsulation layer on the insulating layer and including a first area including a trench and a second area surrounding the trench, a plurality of pixels including an intermediate layer including a first electrode, a second electrode facing the first electrode, and an emission layer between the first electrode and the second electrode, overlapping the second area, and located between the insulating layer and the encapsulation layer, and a polarizing layer on the encapsulation layer and including an opening overlapping the trench, wherein the emission layer does not overlap the first area.

According to some embodiments, the intermediate layer may include a first intermediate layer between the emission layer and the first electrode, and a second intermediate layer between the emission layer and the second electrode. At least one of the first intermediate layer or the second intermediate layer may be continuously located in the first area and the second area without interruption.

According to some embodiments, the second electrode may be continuously located in the first area and the second area without interruption.

According to some embodiments, the display apparatus may further include a capping layer between the second electrode and the encapsulation layer, wherein the capping layer may be continuously located in the first area and the second area without interruption.

According to some embodiments, the display apparatus may further include a refractive index compensation layer between the trench and the substrate and having a refractive index greater than that of air and less than that of the encapsulation layer.

According to one or more embodiments, a display apparatus includes a substrate, an insulating layer on the substrate and including a first area including a first opening and a second area surrounding the first area, a plurality of pixels on the insulating layer, overlapping the second area, and including an intermediate layer including a first electrode, a second electrode facing the first electrode, and an emission layer between the first electrode and the second electrode, an encapsulation layer on the plurality of pixels, and a polarizing layer on the encapsulation layer and including a second opening overlapping the first opening, wherein the emission layer does not overlap the first area.

According to some embodiments, the intermediate layer may include a first intermediate layer between the emission layer and the first electrode, and a second intermediate layer between the emission layer and the second electrode. At least one of the first intermediate layer or the second intermediate layer may be continuously located in the first area and the second area without interruption.

According to some embodiments, the second electrode may be continuously located in the first area and the second area without interruption.

According to some embodiments, the display apparatus may further include a capping layer between the second electrode and the encapsulation layer, wherein the capping layer may be continuously located in the first area and the second area without interruption.

According to some embodiments, the encapsulation layer may include a trench overlapping the first area, and the display apparatus may further include a refractive index compensation layer between the trench and the substrate and having a refractive index greater than that of air and less than that of the encapsulation layer.

Additional aspects will be set forth in part in the description which follows and, in part, will be apparent from the description, or may be learned by practice of the presented embodiments.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
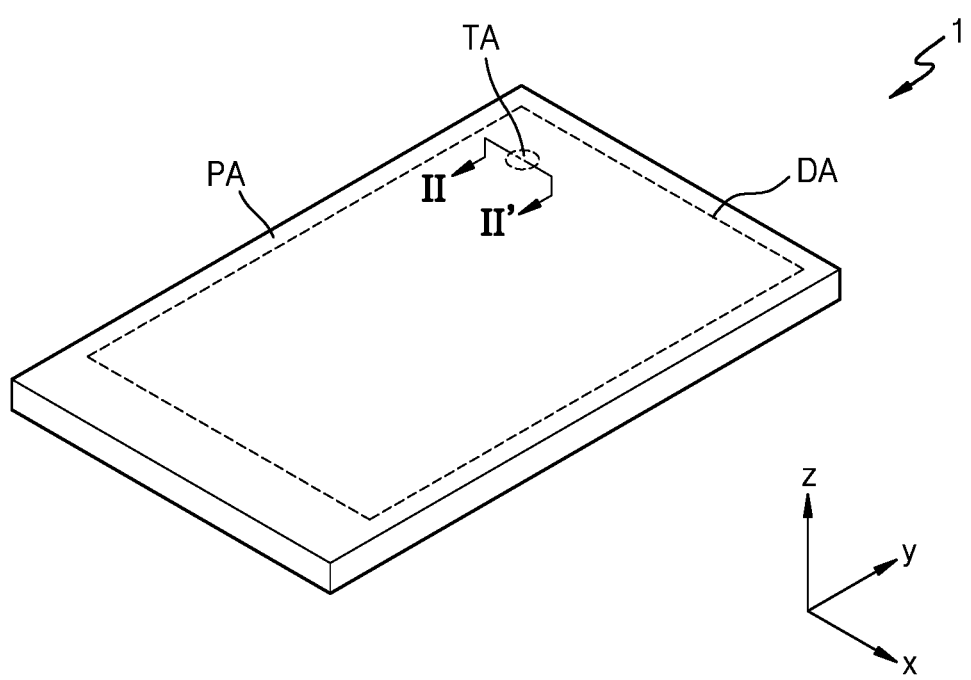
FIG. 1 is a perspective view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of some embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, certain embodiments are illustrated in the drawings and are described in the detailed description. An effect and a characteristic of the disclosure, and a method of accomplishing these will be more apparent when referring to embodiments described with reference to the drawings. Embodiments according to the present disclosure may, however, have many different forms and should not be construed as limited to the embodiments set forth herein.

Reference will now be made in more detail to aspects of some embodiments, which are illustrated in the accompanying drawings, wherein like reference numerals refer to like elements throughout, and repeated description thereof will be omitted.

It will be understood that although the terms "first," "second," etc. may be used herein to describe various components, these components should not be limited by these terms.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it can be directly or indirectly formed on the other layer, region, or element. That is, for example, intervening layers, regions, or elements may be present.

When a certain embodiment may be implemented differently, a specific process order may be performed differently from the described order. For example, two consecutively described processes may be performed substantially at the same time or performed in an order opposite to the described order.

It will be understood that when a layer, region, or component is connected to another portion, the layer, region, or component may be directly connected to the portion or an intervening layer, region, or component may exist, such that the layer, region, or component may be indirectly connected to the portion. For example, when a layer, region, or component is electrically connected to another portion, the layer, region, or component may be directly electrically connected to the portion or may be indirectly connected to the portion through another layer, region, or component.

FIG. 1 is a perspective view of a display apparatus 1 according to some embodiments.

Referring to FIG. 1, the display apparatus 1 may include a transmission area TA, a display area DA surrounding the transmission area TA, and a peripheral area PA surrounding the display area DA.

The display apparatus 1 may display images using light emitted from a plurality of pixels arranged in the display area DA. The transmission area TA may be surrounded by the display area DA. The transmission area TA may be an area in which a component CP (see FIG. 2) is arranged.

Hereinafter, as the display apparatus 1 according to some embodiments, an organic light-emitting display apparatus is described as an example, but a display apparatus according to embodiments of the present disclosure is not limited thereto. According to some embodiments, various types of display apparatuses, such as a liquid crystal display apparatus, an inorganic light emitting display apparatus, and a quantum dot light emitting display apparatus, may be used.

In FIG. 1, one transmission area TA is provided and is shown in a substantially circular shape, but embodiments according to the present disclosure are not limited thereto. The number of transmission areas TA may be two or more, and each shape may be variously changed in a plane such as a circle, an ellipse, a polygon such as a triangle or a square, a star shape, a diamond shape, and an irregular shape.

In addition, the display apparatus 1 may be various electronic devices such as a mobile phone, a laptop computer, and a smart watch.

Figure 2:
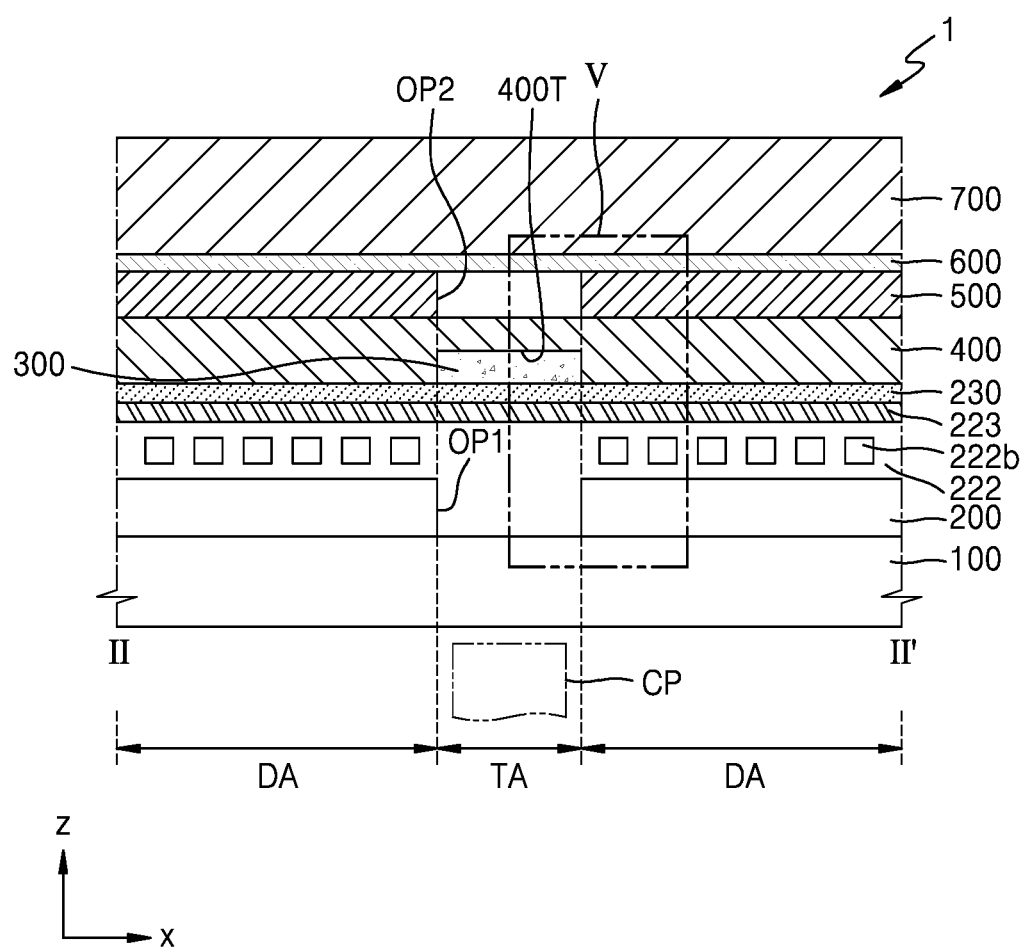
FIG. 2 is a cross-sectional view of a display apparatus according to some embodiments, which is taken along the line II-II' of FIG. 1.

FIG. 2 is a cross-sectional view of a display apparatus according to some embodiments, which is taken along the line II-II' of FIG. 1.

Referring to FIG. 2, the display apparatus 1 includes the transmission area TA and the display area DA surrounding the transmission area TA. The component CP having various functions is located in a position overlapping the transmission area TA, and a plurality of pixels including an emission layer 222b are located in the display area DA.

The component CP may include an electronic element. For example, the component CP may include an electronic element utilizing light or sound. For example, the electronic element may include a sensor that uses light such as an infrared sensor, a camera that captures an image by receiving light, a sensor that outputs and detects light or sound to measure a distance or recognize fingerprints, a small lamp that outputs light, a speaker that outputs sound, and the like. In the case of an electronic element using light, light of various wavelength bands such as visible light, infrared light, ultraviolet light, and the like may be used. In some embodiments, the transmission area TA may be understood as an area in which light or/and sound that is output from the component CP to the outside or that travels from the outside toward the electronic element may be transmitted.

The display apparatus 1 may include a substrate 100, an insulating layer 200, the emission layer 222b, an intermediate layer 222, a second electrode 223, a capping layer 230, a refractive index compensation layer 300, an encapsulation layer 400, a polarization layer 500, an adhesive layer 600, and a cover layer 700.

A plurality of thin-film transistors TFT (see FIG. 5) are located in the insulating layer 200, and a first opening OP1 is formed in the transmission area TA overlapping the component CP, so that the transmittance of the display apparatus 1 may be improved.

The emission layer 222b may not be located in the transmission area TA overlapping the component CP. A plurality of emission layers 222b apart from each other may emit different colors.

The intermediate layer 222 including the emission layer 222b may be continuously located in the transmission area TA and the display area DA without interruption.

The second electrode 223 on the intermediate layer 222 may be continuously located in the transmission area TA and the display area DA without interruption.

The capping layer 230 on the second electrode 223 may be continuously located in the transmission area TA and the display area DA without interruption.

In the encapsulation layer 400 on the capping layer 230, a first trench 400T is formed in the transmission area TA overlapping the component CP, so that the transmittance of the display apparatus 1 may be improved.

The refractive index compensation layer 300 having a refractive index greater than a refractive index of air and less than a refractive index of the encapsulation layer 400 may be located between the first trench 400T of the encapsulation layer 400 and the substrate 100. When air is filled between the encapsulation layer 400 and the substrate 100 instead of the refractive index compensation layer 300, visibility distortion may occur due to air having a less refractive index than that of the encapsulation layer 400. Because the refractive index compensation layer 300 includes a material having a refractive index greater than the refractive index of air and less than the refractive index of the encapsulation layer 400, a difference in refractive index between the encapsulation layer 400 and the refractive index compensation layer 300 may be minimized or reduced, thereby improving visibility distortion.

For example, when the encapsulation layer 400 includes a transparent glass material, the range of the refractive index is approximately 1.5. The refractive index compensation layer 300 may include a silicon resin having a refractive index of about 1.5 to minimize or reduce a difference in refractive index between the encapsulation layer 400 and the refractive index compensation layer 300.

In the polarization layer 500 on the encapsulation layer 400, a second opening OP2 is formed in the transparent area TA overlapping the component CP, so that the transmittance of the display apparatus 1 may be improved.

A cover layer 700 including a transparent material may be on the polarization layer 500, and the adhesive layer 600 may be further between the polarization layer 500 and the cover layer 700.

FIG. 2 shows a case where all of the intermediate layer 222, the second electrode 223, and the capping layer 230 are continuously located in the transmission area TA and the display area DA without interruption, but embodiments according to the present disclosure are not limited thereto. Some of the intermediate layer 222, the second electrode 223, and the capping layer 230 may not be located in the transmission area TA. Detailed descriptions thereof will be described later below.

Figure 3:
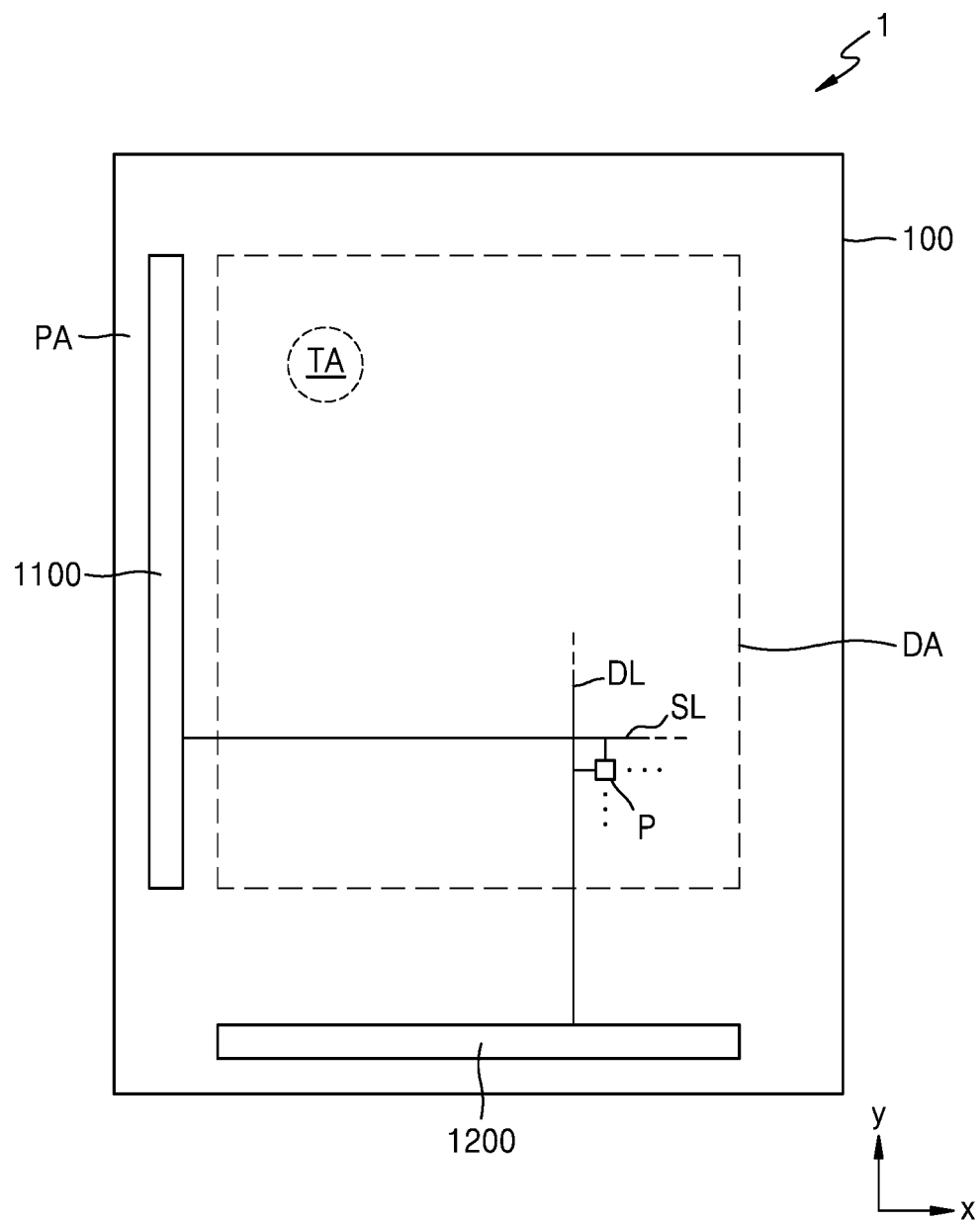
FIG. 3 is a plan view of a display apparatus according to some embodiments.
Figure 4:
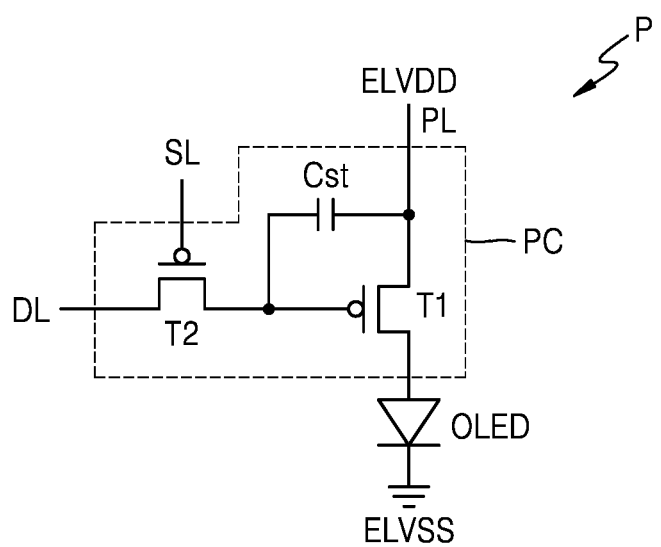
FIG. 4 is an equivalent circuit diagram of one pixel of a display apparatus according to some embodiments.

FIG. 3 is a plan view schematically illustrating the display apparatus 1 according to some embodiments, and FIG. 4 is an equivalent circuit diagram schematically illustrating one pixel P of the display apparatus 1.

Referring to FIGS. 3 and 4, a plurality of pixels P are located in the display area DA, and each pixel P, as shown in FIG. 4, may include a pixel circuit PC and an organic light-emitting diode OLED as a display element connected to the pixel circuit PC.

The pixel circuit PC may include a first thin-film transistor T1, a second thin-film transistor T2, and a storage capacitor Cst. Each pixel P may emit, for example, red, green, or blue light from the organic light-emitting diode OLED. Alternatively, each pixel P may emit, for example, red, green, blue, or white light from the organic light-emitting diode OLED.

The second thin-film transistor T2 is a switching thin-film transistor which is connected to a scan line SL and a data line DL and may transfer a data voltage input from the data line DL to the first thin-film transistor T1 according to a switching voltage input from the scan line SL. The storage capacitor Cst is connected to the second thin-film transistor T2 and a driving voltage line PL and may store a voltage corresponding to a difference between a voltage received from the second thin-film transistor T2 and a first power supply voltage ELVDD supplied to the driving voltage line PL.

The first thin-film transistor T1 includes a driving thin-film transistor which is connected to the driving voltage line PL and the storage capacitor Cst and may control a driving current flowing to the organic light-emitting diode OLED from the driving voltage line PL according to a voltage value stored in the storage capacitor Cst. The organic light-emitting diode OLED may emit light having certain luminance according to the driving current. A cathode of the organic light-emitting diode OLED may be supplied with a second power supply voltage ELVSS.

FIG. 4 illustrates that the pixel circuit PC includes two thin-film transistors and one storage capacitor, but embodiments according to the present disclosure are not limited thereto. The number of thin-film transistors and the number of storage capacitors may be variously changed according to the design of the pixel circuit PC.

Referring again to FIG. 3, the peripheral area PA may include a scan driver 1100 for providing a scan signal to each pixel P, a data driver 1200 for providing a data signal to each pixel P, and a main power line for providing first and second power supply voltages. FIG. 3 shows that the data driver 1200 is adjacent to one side of the substrate 100. According to some embodiments, the data driver 1200 may be on a flexible printed circuit board (FPCB) electrically connected to a pad on one side of the display panel 10.

Figure 5:
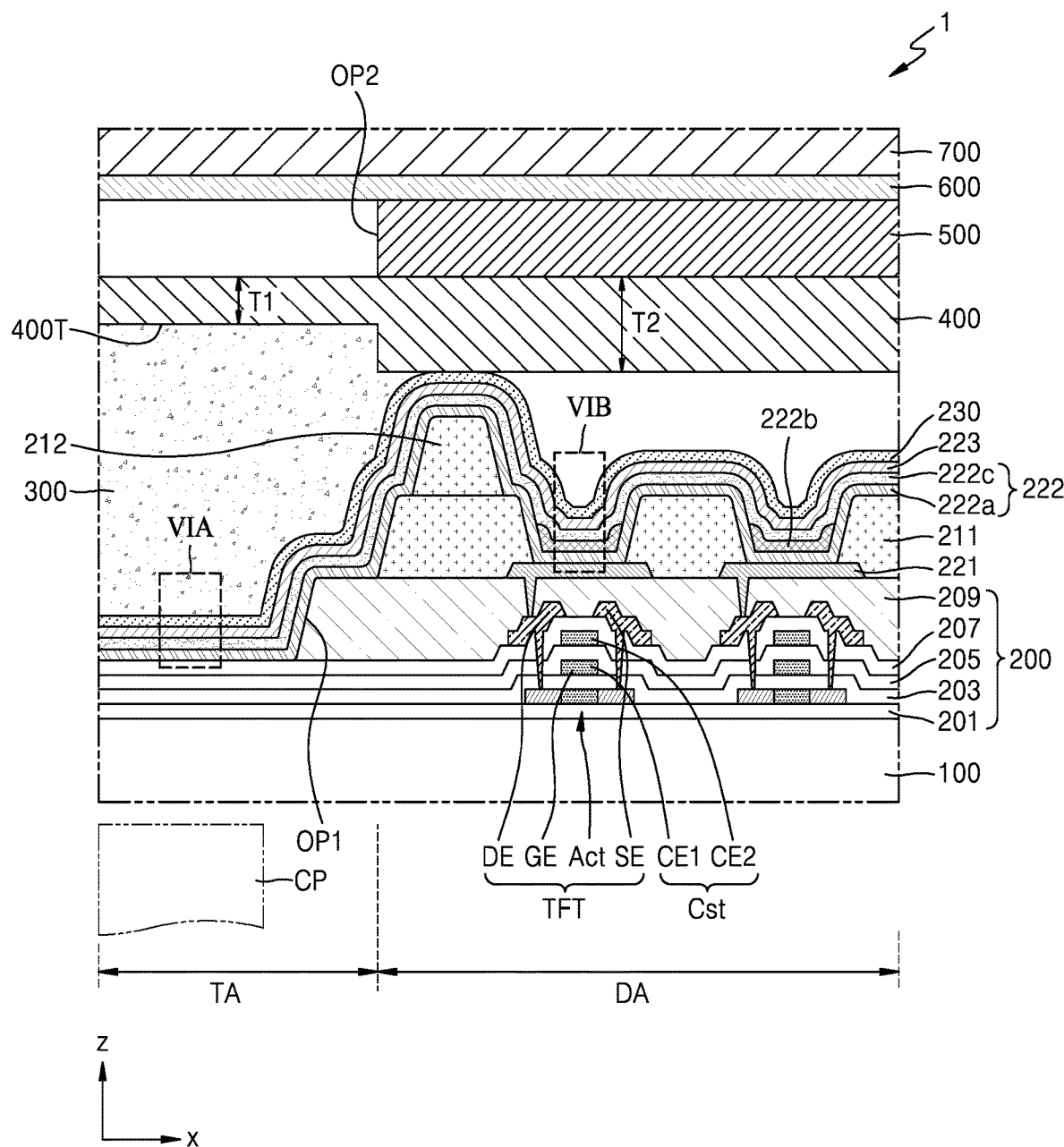
FIG. 5 is a cross-sectional view of a display apparatus according to some embodiments, in which the portion V of FIG. 2 is enlarged.

FIG. 5 is a cross-sectional view of a display apparatus according to some embodiments, in which portion V of FIG. 2 is enlarged.

Referring to FIG. 5, the plurality of thin film transistors TFT are on the substrate 100, and are connected to a plurality of first electrodes 221 that are separated from each other on the insulating layer 200, respectively.

The substrate 100 may include a polymer resin or glass. According to some embodiments, the substrate 100 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), or/and cellulose acetate propionate (CAP), and may be flexible.

The substrate 100 may include a glass material including $SiO_2$ as a main component and a resin such as reinforced plastic, and may be rigid.

The substrate 100 may have a stack structure of a layer including the above-described polymer resin and a barrier layer on the above-described polymer resin layer. For example, the substrate 100 may have a structure in which a first polymer resin layer, a first barrier layer, a second polymer resin layer, and a second barrier layer are stacked. The substrate 100 including the polymer resin may improve flexibility. The barrier layer may include silicon nitride (SiNx), silicon oxynitride (SiON), and silicon oxide (SiOx).

A buffer layer 201 may be formed on the substrate 100 to prevent impurities from penetrating into a semiconductor layer Act of the thin-film transistor TFT. The buffer layer 201 may include an inorganic insulating material such as silicon nitride, silicon oxynitride, and silicon oxide, and may include a single layer or multiple layers including the inorganic insulating material described above.

The thin film transistor TFT and the storage capacitor Cst may be on the buffer layer 201.

The thin-film transistor TFT may include the semiconductor layer Act, a gate electrode GE, a source electrode SE, and a drain electrode DE. The thin-film transistor TFT shown in FIG. 5 may be the driving thin-film transistor described with reference to FIG. 4. According to some embodiments, a top gate-type transistor in which the gate electrode GE is on the semiconductor layer Act with a gate insulating layer 203 therebetween. However, according to some embodiments, the thin-film transistor TFT may be a bottom gate-type transistor.

The semiconductor layer Act may include polysilicon. Alternatively, the semiconductor layer Act may include amorphous silicon, an oxide semiconductor, an organic semiconductor, or the like. The gate electrode GE may include a low resistance metal material. The gate electrode GE may include a conductive material including molybdenum (Mo), aluminum (Al), copper (Cu), titanium (Ti), or the like, and may be formed as a single layer or multiple layers including the above-described materials.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, hafnium oxide, and the like. The gate insulating layer 203 may include a single layer or multiple layers including the above-described materials.

The source electrode SE and the drain electrode DE may include a material having relatively high or good conductivity. The source electrode SE and the drain electrode DE may include a conductive material including Mo, Al, Cu, Ti, or the like, and may be formed as a single layer or multiple layers including the above-described materials. According to some embodiments, the source electrode SE and the drain electrode DE may include multiple layers of Ti/Al/Ti.

The storage capacitor Cst may include a lower electrode CE1 and an upper electrode CE2 which overlap each other with a first interlayer insulating layer 205 therebetween. The storage capacitor Cst may overlap the thin-film transistor TFT. FIG. 5 shows that the gate electrode GE of the thin-film transistor TFT is the lower electrode CE1 of the storage capacitor Cst. According to some embodiments, the storage capacitor Cst may not overlap the thin-film transistor TFT. The storage capacitor Cst may be covered with a second interlayer insulating layer 207.

The first and second interlayer insulating layers 205 and 207 may include an inorganic insulating material such as silicon oxide, silicon nitride, silicon oxynitride, aluminum oxide, titanium oxide, tantalum oxide, hafnium oxide, and the like. The first and second interlayer insulating layers 205 and 207 may include a single layer or multiple layers including the above-described materials.

The thin-film transistor TFT and the storage capacitor Cst may be covered with a planarization insulating layer 209. The planarization insulating layer 209 may include an approximately planar upper surface. The planarization insulating layer 209 may include an organic insulation material such as a general commercial polymer such as polymethylmethacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, and/or a blend thereof. According to some embodiments, the planarization insulating layer 209 may include polyimide. Alternatively, the planarization insulating layer 209 may include an inorganic insulating material. Alternatively, the planarization insulating layer 209 may include both an organic insulating material and an inorganic insulating material.

The first opening OP1 is formed in the planarization insulating layer 209 at a position overlapping the component CP, so that transmittance may be improved.

FIG. 5 illustrates a structure in which the first opening OP1 is formed only in the planarization insulating layer 209, but embodiments according to the present disclosure are not limited thereto. The first opening OP1 may be formed not only in the planarization insulating layer 209 but also in the second interlayer insulating layer 207. According to some embodiments, the first opening OP1 may be formed in the planarization insulating layer 209, the second interlayer insulating layer 207, and the first interlayer insulating layer 205. According to some embodiments, the first opening OP1 may be formed in the planarization insulating layer 209, the second interlayer insulating layer 207, the first interlayer insulating layer 205, and the gate insulating layer 203. According to some embodiments, the first opening OP1 may be formed in the planarization insulating layer 209, the second interlayer insulating layer 207, the first interlayer insulating layer 205, the gate insulating layer 203, and the buffer layer 201.

A first electrode 221 may be formed on the planarization insulating layer 209. The first electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the first electrode 221 may include a reflective layer including silver (Ag), magnesium (Mg), Al, platinum (Pt), palladium (Pd), gold (Au), nickel (Ni), neodymium (Nd), iridium (Ir), chromium (Cr), or a compound thereof. According to some embodiments, the first electrode 221 may further include a film formed of ITO, IZO, ZnO, or $In_2O_3$ above or/and below the above-described reflective layer.

A pixel defining layer 211 may be formed on the first electrode 221. The pixel defining layer 211 may include an opening exposing an upper surface of the pixel electrode 221 and may cover an edge of the pixel electrode 221. The pixel defining layer 211 may include an organic insulating material. Alternatively, the pixel defining layer 211 may include an inorganic insulating material such as silicon nitride (SiNx), silicon oxynitride (SiON), or silicon oxide (SiOx). Alternatively, the pixel defining layer 211 may include an organic insulating material and an inorganic insulating material.

The intermediate layer 222 includes the emission layer 222b. The emission layer 222b may be arranged for each pixel in the display area DA.

The intermediate layer 222 may further include a first intermediate layer 222a arranged between the emission layer 222b and the first electrode 221 and/or a second intermediate layer 222c between the emission layer 222b and the second electrode 223. The emission layer 222b may include a polymer organic material or a low molecular weight organic material that emits light of a certain color.

The first intermediate layer 222a may include a single layer or multiple layers. For example, when the first intermediate layer 222a includes a polymer material, the first intermediate layer 222a, which is a hole transport layer (HTL) having a single-layer structure, may include poly-(3,4-ethylenedioxythiophene) (PEDOT) or polyaniline (PANI). When the first intermediate layer 222a includes a low molecular weight material, the first intermediate layer 222a may include a hole injection layer (HIL) and a hole transport layer (HTL).

The second intermediate layer 222c may be omitted. For example, when the first intermediate layer 222a and the emission layer 222b include a polymer material, the second intermediate layer 222c may be formed. The second intermediate layer 222c may include a single layer or multiple layers. The second intermediate layer 222c may include an electron transport layer (ETL) and/or an electron injection layer (EIL).

Unlike the emission layer 222b, the first and second intermediate layers 222a and 222c may be located in the transmission area TA overlapping the component CP.

The second electrode 223 may include a conductive material having a low work function. For example, the second electrode 223 may include a transparent layer or a semi-transparent layer including Ag, Mg, Al, Pt, Pd, Au, Ni, Nd, Ir, Cr, lithium (Li), calcium (Ca), or an alloy thereof. Alternatively, the second electrode 223 may further include a layer such as ITO, IZO, ZnO, or $In_2O_3$ on the transparent or semi-transparent layer including the above-described material.

Unlike the emission layer 222b, the second electrode 223 may be located in the transmission area TA overlapping the component CP.

The capping layer 230 may be on the second electrode 223. For example, the capping layer 230 may include LiF and may be formed by thermal evaporation. Alternatively, the capping layer 230 may include an inorganic insulating material such as silicon oxide, silicon nitride, or silicon oxynitride. Alternatively, the capping layer 230 may include an organic insulating material.

Unlike the emission layer 222b, the capping layer 230 may be arranged in the transmission area TA overlapping the component CP.

A spacer 212 may be formed on the pixel defining layer 211. The spacer 212 may include an organic insulating material such as polyimide. Alternatively, the spacer 212 may include an inorganic insulating material such as silicon nitride or silicon oxide, or may include an organic insulating material and an inorganic insulating material.

The spacer 212 may include a material different from a material of the pixel defining layer 211. Alternatively, the spacer 212 may include the same material as that of the pixel defining layer 211. In this case, the pixel defining layer 211 and the spacer 212 may be formed together in a mask process using a halftone mask or the like. According to some embodiments, the pixel defining layer 211 and the spacer 212 may include polyimide.

The spacer 212 may be formed to surround the transmission area TA in which the first opening OP1 is formed.

The transmission area TA and the display area DA may be covered by the encapsulation layer 400.

The encapsulation layer 400 may include a hard material. For example, the encapsulation layer 400 may include a glass material.

In the encapsulation layer 400, the first trench 400T is formed in an area overlapping the first opening OP1, so that transmittance of the display apparatus 1 may be improved. For example, a first thickness T1 of the encapsulation layer 400 in the area overlapping the first opening OP1 may be less than a second thickness T2 of the encapsulation layer 400 in an area not overlapping the first opening OP1. However, the first thickness T1 may be greater than 0, so that the encapsulation layer 400 may be formed to encapsulate the entire display area DA and the transmission area TA.

The first trench 400T may have various shapes. For example, the first trench 400T may be formed in a circular or polygonal shape on a plan view, and may be formed to correspond to the number and shape of the first openings OP1 formed in the insulating layer 200.

The refractive index compensation layer 300 having a refractive index greater than the refractive index of air and less than the refractive index of the encapsulation layer 400 may be located between the first trench 400T of the encapsulation layer 400 and the substrate 100. In more detail, the refractive index compensation layer 300 may be surrounded by the encapsulation layer 400 on an upper portion thereof, the insulating layer 200 on a lower portion thereof, and the spacer 212 on a side surface thereof.

When air is filled between the encapsulation layer 400 and the substrate 100 instead of the refractive index compensation layer 300, visibility distortion may occur due to air having a less refractive index than that of the encapsulation layer 400. Because the refractive index compensation layer 300 includes a material having a refractive index greater than the refractive index of air and less than the refractive index of the encapsulation layer 400, a difference in refractive index between the encapsulation layer 400 and the refractive index compensation layer 300 may be minimized or reduced, thereby improving visibility distortion.

The polarization layer 500 may be on the encapsulation layer 400.

In the polarization layer 500, the second opening OP2 is formed in the area overlapping the component CP, so that the transmittance of the display apparatus 1 may be improved. The second opening OP2 of the polarization layer 500 overlaps each of the first opening OP1 of the insulating layer 200 and the first trench 400T of the encapsulation layer 400, thereby maximizing transmittance of the display apparatus 1.

The second opening OP2 may have various shapes. For example, the second opening OP2 may be formed in a circular or polygonal shape on a plan view, and may be formed to correspond to the number and shape of the first openings OP1 of the insulating layer 200. In addition, the second opening OP2 may be formed to correspond to the number and shape of the first trench 400T.

The cover layer 700 including a transparent material may be on the polarization layer 500.

The cover layer 700 may be coupled to a housing, and the component CP may be located in an inner space of the housing.

The adhesive layer 600 such as an optical clear adhesive (OCA) is arranged between the polarization layer 500 and the cover layer 700, so that the coupling of the polarization layer 500 to the cover layer 700 may be maintained.

Figure 6:
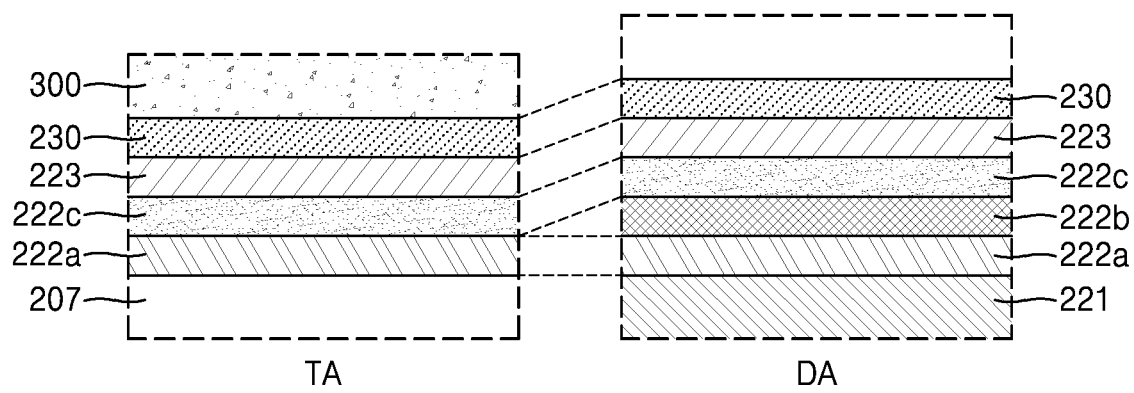
FIG. 6 is an enlarged cross-sectional view of the portions VIA and VIB of FIG. 5.

FIG. 6 is an enlarged cross-sectional view of portions VIA and VIB of FIG. 5.

Referring to FIG. 6, in the transmission area TA, the first intermediate layer 222a, the second intermediate layer 222c, the second electrode 223, the capping layer 230, and the refractive index compensation layer 300 are sequentially arranged on the second interlayer insulating layer 207. In the display area DA, the first intermediate layer 222a, the emission layer 222b, the second intermediate layer 222c, the second electrode 223, the capping layer 230, and the refractive index compensation layer 300 are sequentially arranged on the first electrode 221.

According to an embodiment of FIG. 6, the emission layer 222b is located only in the display area DA and not in the transmission area DA. On the other hand, unlike the emission layer 222b, the first intermediate layer 222a, the second intermediate layer 222c, the second electrode 223, and the capping layer 230 are continuously located in both the transmission area TA and the display area DA without interruption.

Figure 7:
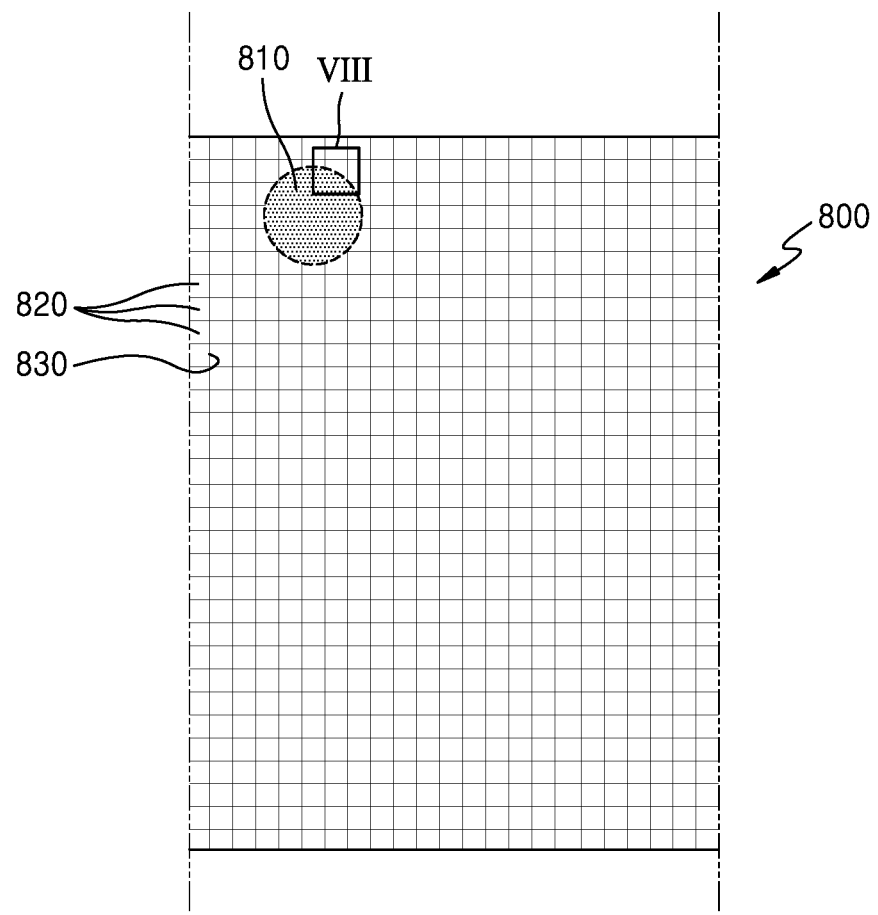
FIG. 7 is a plan view of a fine metal mask used according to some embodiments.
Figure 8:
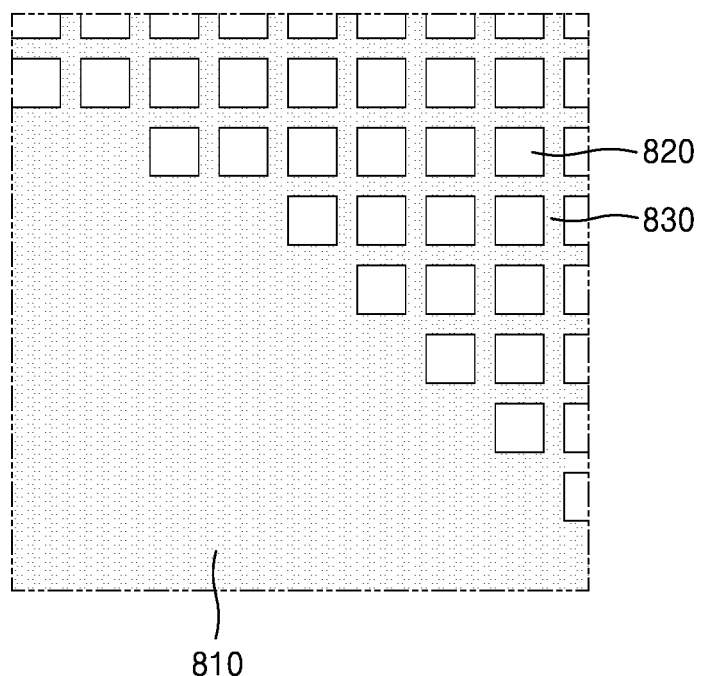
FIG. 8 is an enlarged cross-sectional view of the portion VIII of FIG. 7.

FIG. 7 is a plan view of a fine metal mask (FMM) 800 used according to some embodiments, and FIG. 8 is an enlarged cross-sectional view of the portion VIII of FIG. 7.

Referring to FIGS. 7 and 8, the fine metal mask 800 includes a non-porous portion 810, a plurality of openings 820, and a bridge 830 connecting the plurality of openings 820.

In a method of forming the emission layer 222b so as to be apart from each pixel in the display area DA, deposition may be performed using the fine metal mask 800 in which the plurality of openings 820 are formed in an area corresponding to each emission layer 222b. When the non-porous portion 810 is formed in an area corresponding to the transmission area TA in order to prevent the emission layer 222b from being located in the transmission area TA, the emission layer 222b is not deposited in the transmission area TA because the non-porous portion 810 serves as a film blocking a deposition material.

Figure 9A:
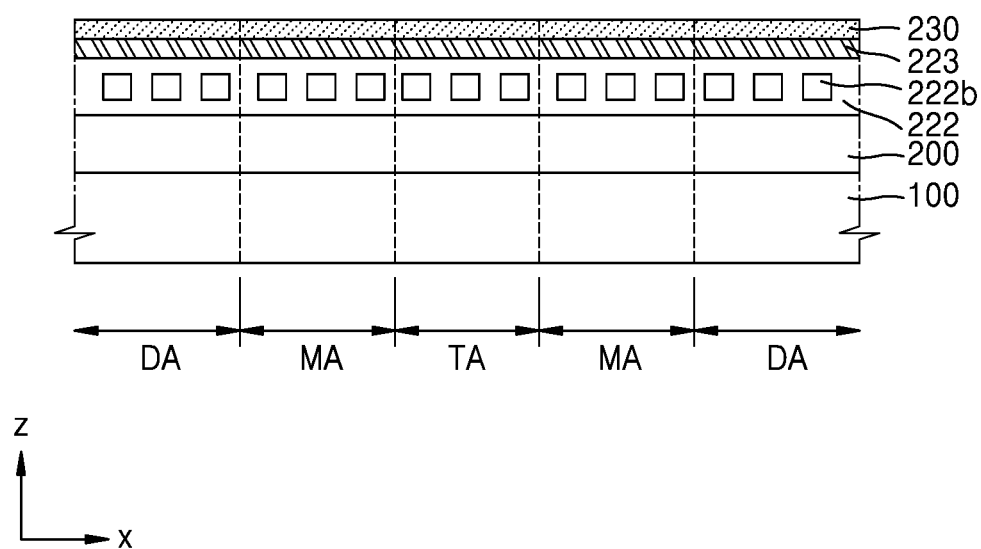
FIGS. 9A and 9B are cross-sectional views illustrating a method of forming a transmission area by a laser etching method according to some embodiments.
Figure 9B:
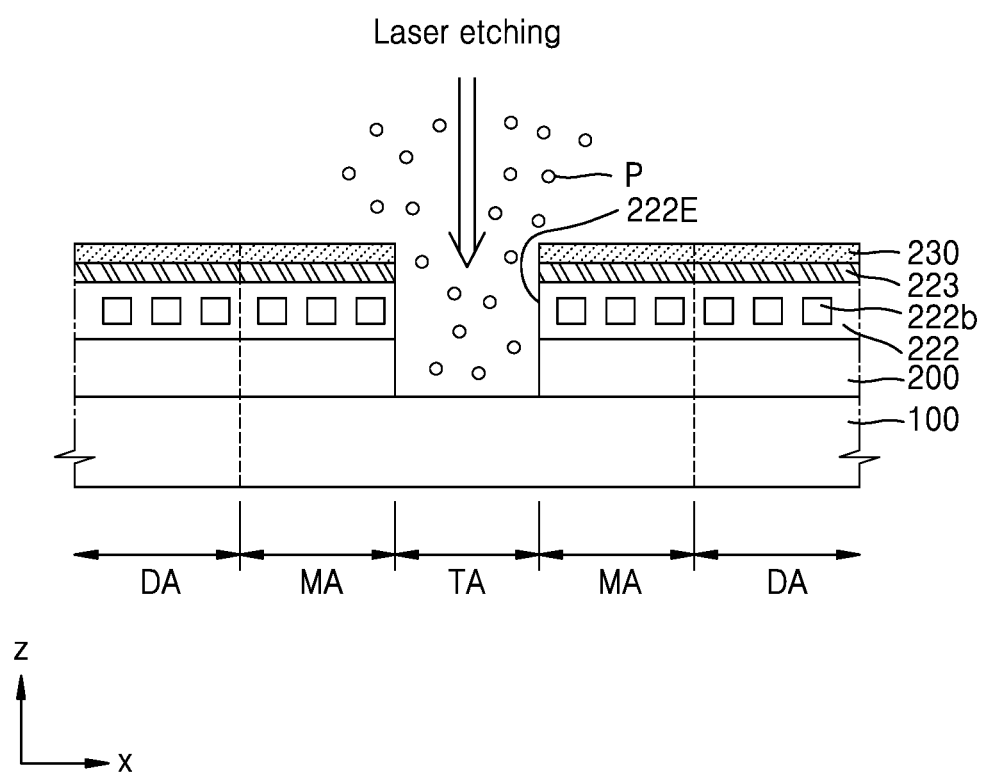

FIGS. 9A and 9B are cross-sectional views illustrating a method of forming the transmission area TA by a laser etching method.

Referring to FIG. 9A, without distinction between the transmission area TA and the display area DA, the intermediate layer 222 including the emission layer 222b, the second electrode 223, and the capping layer 230 are formed on the substrate 100 and an insulating layer 200 by a deposition process.

Referring to FIG. 9B, an opening is formed by etching the capping layer 230, the second electrode 223, the intermediate layer 222, the emission layer 222b, and the insulating layer 200 formed in the transmission area TA by using a laser beam on a portion of the structure of FIG. 9A where the transmission area TA is to be formed.

In the laser etching method as described above, because an etching process using a separate laser beam is added after all deposition materials such as the insulating layer 200, the emission layer 222b, the intermediate layer 222, the second electrode 223, and the capping layer 230 are deposited on the substrate 100, there are problems of product price increase due to additional facility investment and a decrease in mass productivity due to an increase in process. In addition, there is a problem that defect factors increase due to the generation of particles due to laser etching. In addition, because the display area DA needs to be formed with a sufficient margin on an etching surface 222E of the intermediate layer 222 damaged by laser etching, there is a problem in that a dead space increases in a process of securing an intermediate area MA having a certain width or more between the transmission area TA and the display area DA.

However, in the case of the disclosure, after the deposition process, a non-porous portion is formed in a mask used in an existing deposition process instead of a laser etching process, which is a separate facility process, thereby preventing problems of product price increase due to additional facility investment and a decrease in mass productivity due to an increase in process. In addition, because defect factors due to the generation of particles by laser etching are eliminated and damage to the side of an opening due to laser etching does not occur, a dead space between the display area DA and the transmission area TA may be reduced.

Compared to the structure of FIG. 9B, the structure of the disclosure further includes the intermediate layer 222, the second electrode 223, and the capping layer 230 in the transmission area TA. However, the structure of the disclosure may control the appropriate transmittance by controlling the thickness of each layer.

Figure 10:
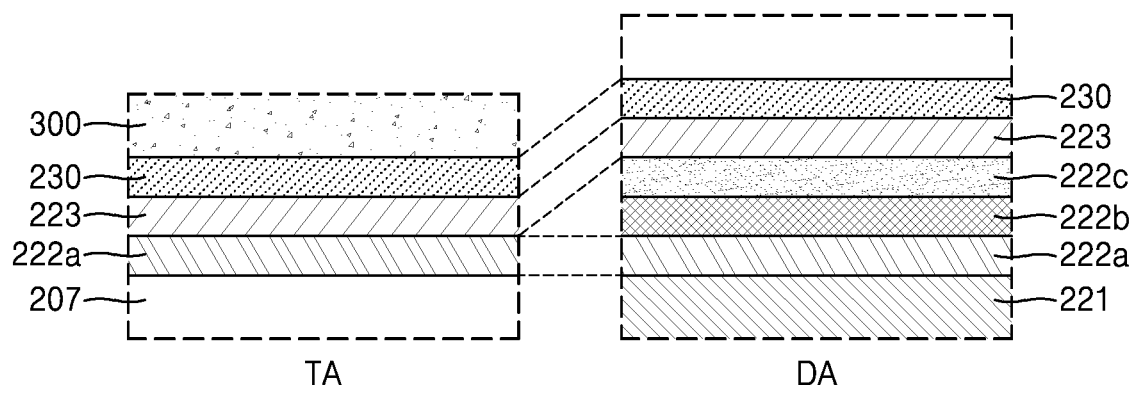
FIGS. 10 to 12 are cross-sectional views showing example combinations of various deposits deposited on a transmission area and a display area according to some embodiments.
Figure 11:
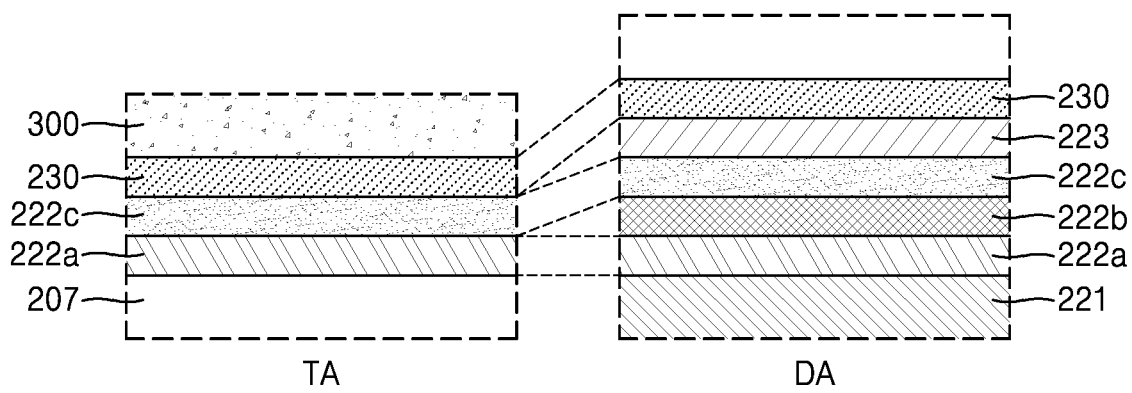
Figure 12:
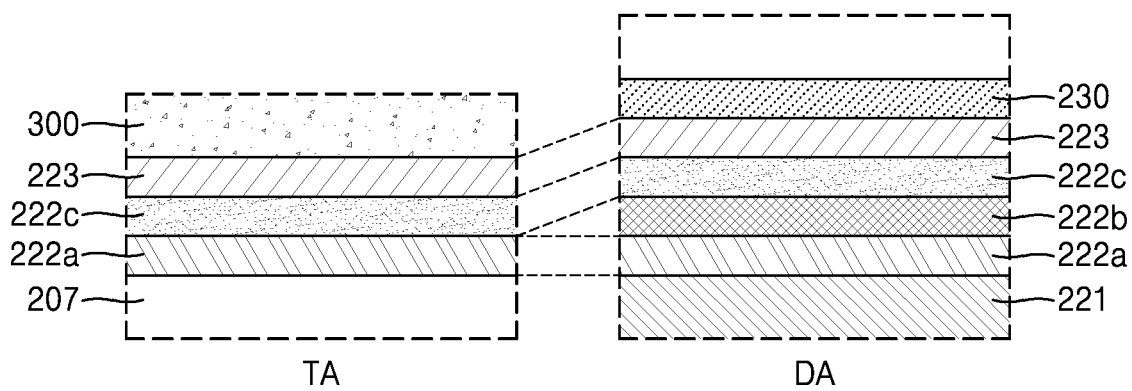

FIGS. 10 to 12 are cross-sectional views showing example combinations of various deposits deposited on a transmission area and a display area.

Referring to FIG. 10, in the transmission area TA, the first intermediate layer 222a, the second electrode 223, the capping layer 230, and the refractive index compensation layer 300 are sequentially arranged on the second interlayer insulating layer 207. In the display area DA, the first intermediate layer 222a, the emission layer 222b, the second electrode 223, the capping layer 230, and the refractive index compensation layer 300 are sequentially arranged on the first electrode 221.

According to an embodiment of FIG. 10, the emission layer 222b is located only in the display area DA and not in the transmission area DA. On the other hand, unlike the emission layer 222b, the first intermediate layer 222a, the second electrode 223, and the capping layer 230 are continuously located in both the transmission area TA and the display area DA without interruption. Compared with the embodiment of FIG. 6, because the second intermediate layer 222c is not formed in the transmission area TA, the transmittance of the display apparatus may be further improved.

Referring to FIG. 11, in the transmission area TA, the first intermediate layer 222a, the second intermediate layer 222c, the capping layer 230, and the refractive index compensation layer 300 are sequentially arranged on the second interlayer insulating layer 207. In the display area DA, the first intermediate layer 222a, the emission layer 222b, the second intermediate layer 222c, the capping layer 230, and the refractive index compensation layer 300 are sequentially arranged on the first electrode 221.

According to an embodiment of FIG. 11, the emission layer 222b is located only in the display area DA and not in the transmission area DA. On the other hand, unlike the emission layer 222b, the first intermediate layer 222a, the second intermediate layer 222c, and the capping layer 230 are continuously located in both the transmission area TA and the display area DA without interruption. Compared with the embodiment of FIG. 6, because the second intermediate layer 222c is not formed in the transmission area TA, the transmittance of the display apparatus may be further improved.

Referring to FIG. 12, in the transmission area TA, the first intermediate layer 222a, the second intermediate layer 222c, the capping layer 230, and the refractive index compensation layer 300 are sequentially arranged on the second interlayer insulating layer 207. In the display area DA, the first intermediate layer 222a, the emission layer 222b, the second intermediate layer 222c, the capping layer 230, and the refractive index compensation layer 300 are sequentially arranged on the first electrode 221.

According to some embodiments, as illustrated in FIG. 12, the emission layer 222b is located only in the display area DA and not in the transmission area DA. On the other hand, unlike the emission layer 222b, the first intermediate layer 222a, the second intermediate layer 222c, and the second electrode 223 are continuously located in both the transmission area TA and the display area DA without interruption. Compared with the embodiment of FIG. 6, because the capping layer 230 is not formed in the transmission area TA, the transmittance of the display apparatus may be further improved.

The embodiments of FIGS. 10 to 12 illustrate a structure in which one of the first intermediate layer 222a, the second intermediate layer 222c, the second electrode 223, and the capping layer 230 is not located in the transmission area TA. However, embodiments according to the present disclosure are not limited thereto. According to some embodiments, at least two or more of the first intermediate layer 222a, the second intermediate layer 222c, the second electrode 223, and the capping layer 230 may not be located in the transmission area TA.

Meanwhile, the first intermediate layer 222a, the second intermediate layer 222c, the second electrode 223, and the capping layer 230 may be formed not as a fine metal mask including a plurality of openings, but as an open mask having one opening in one display apparatus. To prevent at least one of the first intermediate layer 222a, the second intermediate layer 222c, the second electrode 223, or the capping layer 230 from being formed in the transmission area TA by using the open mask, the open mask may include a non-porous portion, and a small number of bridges for coupling the non-porous portion to the open mask may be further added to the open mask.

Figure 13:
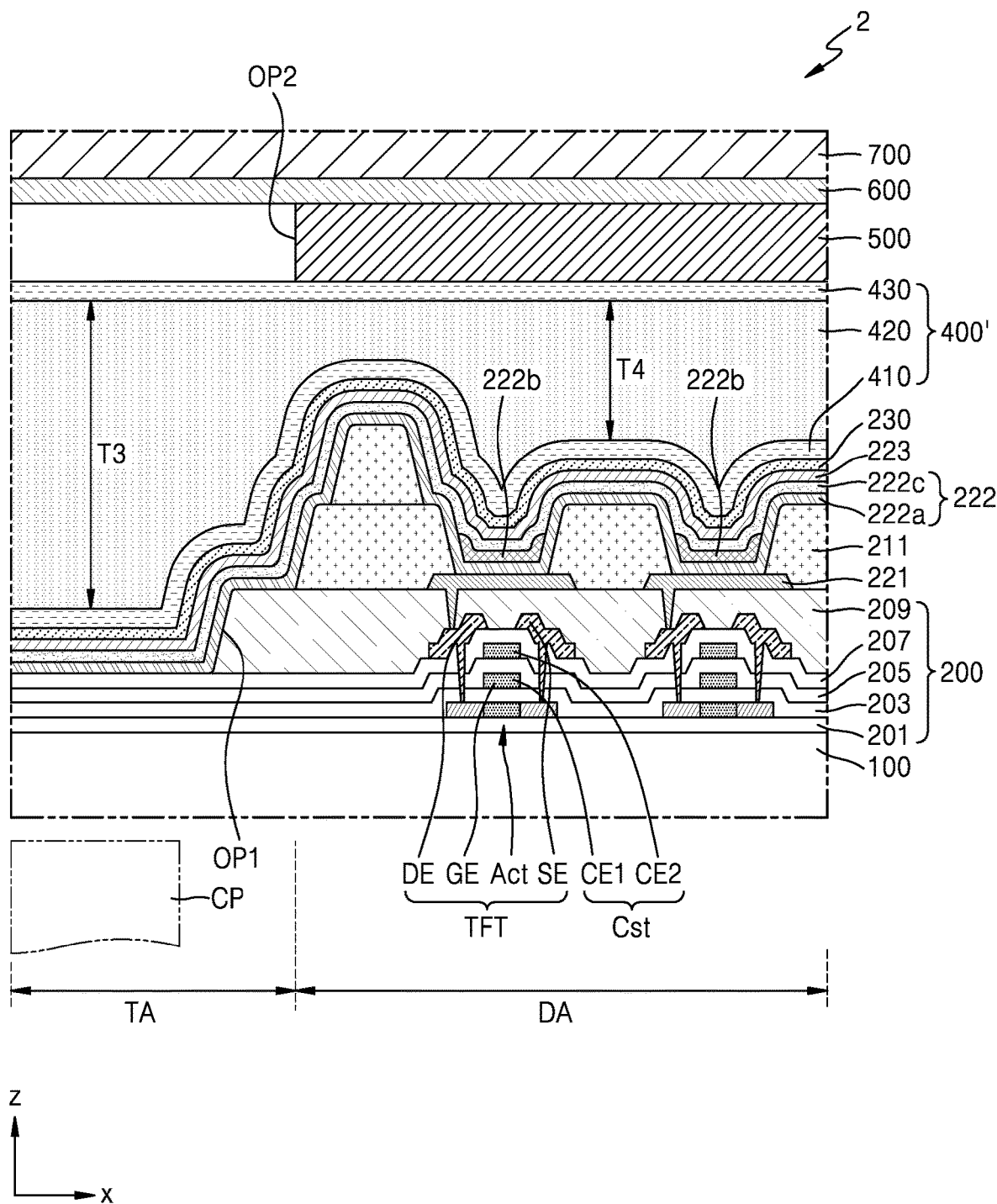
FIG. 13 is a cross-sectional view of a display apparatus according to some embodiments.

FIG. 13 is a cross-sectional view of a display apparatus 2 according to some embodiments. Hereinafter, differences from the display apparatus 1 of FIG. 5 will be mainly described.

Referring to FIG. 13, the display apparatus 2 may include a substrate 100, an insulating layer 200, the emission layer 222b, an intermediate layer 222, the second electrode 223, the capping layer 230, the refractive index compensation layer 300, an encapsulation layer 400', the polarization layer 500, the adhesive layer 600, and the cover layer 700.

The plurality of thin-film transistors TFT are located in the insulating layer 200, and the first opening OP1 is formed in the transmission area TA overlapping the component CP, so that the transmittance of the display apparatus 2 may be improved. The emission layer 222b may not be located in the transmission area TA overlapping the component CP. The intermediate layer 222 including the emission layer 222b may be continuously located in the transmission area TA and the display area DA without interruption.

The second electrode 223 on the intermediate layer 222 may be continuously arranged in the transmission area TA and the display area DA without interruption. The capping layer 230 on the second electrode 223 may be continuously arranged in the transmission area TA and the display area DA without interruption.

Unlike the display apparatus 1 of FIG. 5, a trench is not formed in the encapsulation layer 400' on the capping layer 230 of the display apparatus 2. The encapsulation layer 400' may be continuously located in the transmission area TA and the display area DA without interruption.

In the polarization layer 500 on the encapsulation layer 400', a second opening OP2 is formed in the transmission area TA overlapping the component CP, so that the transmittance of the display apparatus 2 may be improved. The cover layer 700 including a transparent material may be on the polarization layer 500, and the adhesive layer 600 may be further located between the polarization layer 500 and the cover layer 700.

According to some embodiments, the encapsulation layer 400' may include a first inorganic encapsulation layer 410, a second inorganic encapsulation layer 430, and an organic encapsulation layer 420 between the first inorganic encapsulation layer and the second inorganic encapsulation layer.

The first and second inorganic encapsulation layers 410 and 430 may include one or more inorganic insulating materials such as aluminum oxide, titanium oxide, tantalum oxide, hafnium oxide, zinc oxide, silicon oxide, silicon nitride, or silicon oxynitride and may be formed using a CVD method or the like.

The organic encapsulation layer 420 may include polyethylene terephthalate, polyethylene naphthalate, polycarbonate, polyimide, polyethylene sulfonate, polyoxymethylene, polyarylate, hexamethyldisiloxane, an acrylic resin (e.g., polymethyl methacrylate, a polyacrylic acid, etc.), or any combination thereof.

A thickness T3 of an area in which the organic encapsulation layer 420 overlaps the first opening OP1 and the second opening OP2 may be greater than a thickness T4 of an area in which the organic encapsulation layer 420 does not overlap the first opening OP1 and the second opening OP2. In other words, the thickness T3 of the organic encapsulation layer 420 in the transmission area TA is greater than the thickness T4 of the organic encapsulation layer 420 in the display area DA, so that an upper surface of the display apparatus 2 may be entirely planarized.

The first inorganic encapsulation layer 410 is continuously located in the display area DA and the transmission area TA without interruption to completely cover the intermediate layer 222, the second electrode 223, and the capping layer 230, thereby preventing the inflow of impurities through the first opening OP1 formed in the insulating layer 200.

In addition, unlike the display apparatus 1 of FIG. 5, the display apparatus 2 does not include a separate refractive index compensation layer, and may improve visibility distortion by adjusting a refractive index of the organic encapsulation layer 420.

Figure 14:
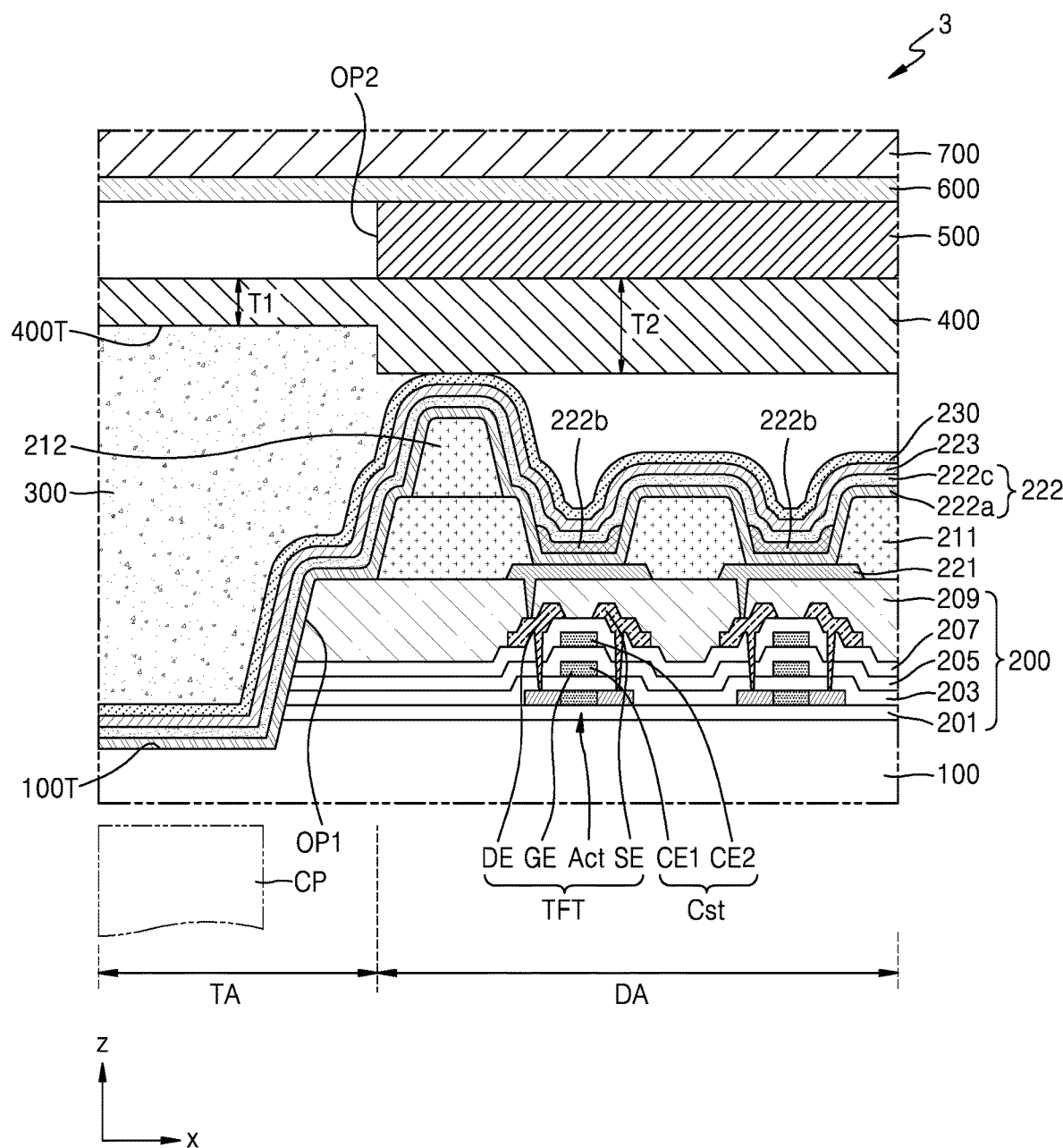
FIG. 14 is a cross-sectional view of a display apparatus according to some embodiments.

FIG. 14 is a cross-sectional view of a display apparatus 3 according to some embodiments. Hereinafter, differences from the display apparatus 1 of FIG. 5 will be mainly described.

Referring to FIG. 14, the display apparatus 3 may include the substrate 100, the insulating layer 200, the emission layer 222b, the intermediate layer 222, the second electrode 223, the capping layer 230, the refractive index compensation layer 300, the encapsulation layer 400, the polarization layer 500, the adhesive layer 600, and the cover layer 700.

The plurality of thin-film transistors TFT are located in the insulating layer 200, and the first opening OP1 is formed in the transmission area TA overlapping the component CP, so that the transmittance of the display apparatus 3 may be improved.

The emission layer 222b may not be located in the transmission area TA overlapping the component CP. The intermediate layer 222 including the emission layer 222b may be continuously located in the transmission area TA and the display area DA without interruption.

The second electrode 223 on the intermediate layer 222 may be continuously arranged in the transmission area TA and the display area DA without interruption. The capping layer 230 on the second electrode 223 may be continuously arranged in the transmission area TA and the display area DA without interruption.

In the encapsulation layer 400 on the capping layer 230, the first trench 400T is formed in the transmission area TA overlapping the component CP, so that the transmittance of the display apparatus 3 may be improved.

Unlike the display apparatus 1 of FIG. 5, in the substrate 100 of the display apparatus 3, a second trench 100T is formed in the transmission area TA overlapping the component CP, so that the transmittance of the display apparatus 3 may be improved.

The refractive index compensation layer 300 having a refractive index greater than the refractive index of air and less than the refractive index of the encapsulation layer 400 may be located between the first trench 400T of the encapsulation layer 400 and the second trench 100T of the substrate 100, thereby improving (e.g., reducing) visibility distortion of the display apparatus 3.

Figure 15:
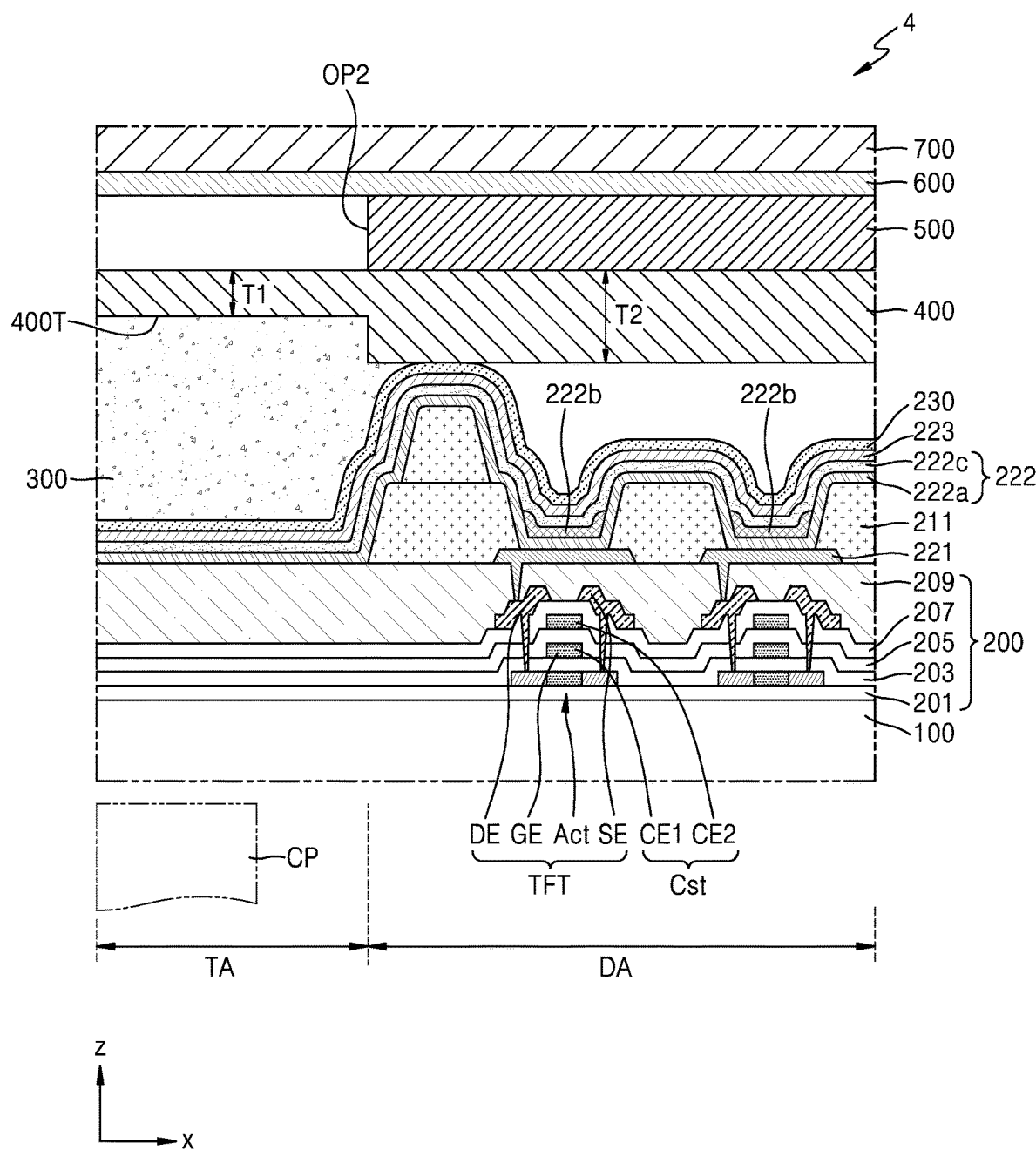
FIG. 15 is a cross-sectional view of a display apparatus according to some embodiments.

FIG. 15 is a cross-sectional view of a display apparatus 4 according to some embodiments. Hereinafter, differences from the display apparatus 1 of FIG. 5 will be mainly described.

Referring to FIG. 15, the display apparatus 4 may include the substrate 100, the insulating layer 200, the emission layer 222b, the intermediate layer 222, the second electrode 223, the capping layer 230, the refractive index compensation layer 300, the encapsulation layer 400, the polarization layer 500, the adhesive layer 600, and the cover layer 700.

Unlike the display apparatus 1 of FIG. 5, the first opening OP1 (see FIG. 5) is not formed in the insulating layer 200 of the display apparatus 4. By omitting a process of forming the first opening OP1, the process of FIG. 15 may be simplified.

The emission layer 222b may not be located in the transmission area TA overlapping the component CP. The intermediate layer 222 including the emission layer 222b may be continuously located in the transmission area TA and the display area DA without interruption.

The second electrode 223 on the intermediate layer 222 may be continuously arranged in the transmission area TA and the display area DA without interruption. The capping layer 230 on the second electrode 223 may be continuously arranged in the transmission area TA and the display area DA without interruption.

In the encapsulation layer 400 on the capping layer 230, the first trench 400T is formed in the transmission area TA overlapping the component CP, so that the transmittance of the display apparatus 4 may be improved.

The refractive index compensation layer 300 having a refractive index greater than the refractive index of air and less than the refractive index of the encapsulation layer 400 may be located between the first trench 400T of the encapsulation layer 400 and the substrate 100, thereby improving visibility distortion of the display apparatus 4.

Figure 16:
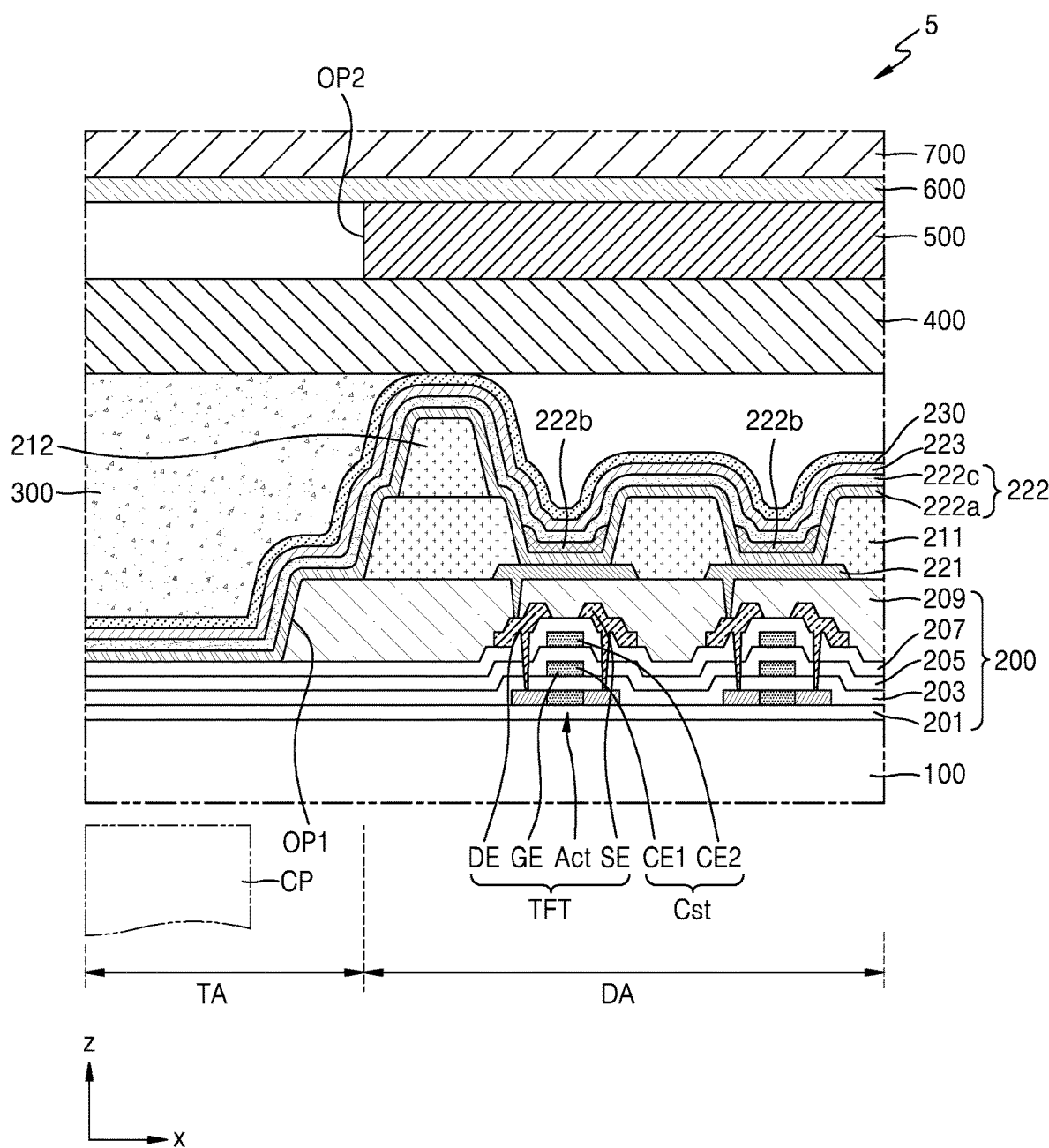
FIG. 16 is a cross-sectional view of a display apparatus according to some embodiments.

FIG. 16 is a cross-sectional view of a display apparatus 5 according to some embodiments. Hereinafter, differences from the display apparatus 1 of FIG. 5 will be mainly described.

Referring to FIG. 16, the display apparatus 5 may include the substrate 100, the insulating layer 200, the emission layer 222b, the intermediate layer 222, the second electrode 223, the capping layer 230, the refractive index compensation layer 300, the encapsulation layer 400, the polarization layer 500, the adhesive layer 600, and the cover layer 700.

The plurality of thin-film transistors TFT are located in the insulating layer 200, and the first opening OP1 is formed in the transmission area TA overlapping the component CP, so that the transmittance of the display apparatus 5 may be improved.

The emission layer 222b may not be located in the transmission area TA overlapping the component CP. The intermediate layer 222 including the emission layer 222b may be continuously located in the transmission area TA and the display area DA without interruption.

The second electrode 223 on the intermediate layer 222 may be continuously arranged in the transmission area TA and the display area DA without interruption. The capping layer 230 on the second electrode 223 may be continuously arranged in the transmission area TA and the display area DA without interruption.

Unlike the display apparatus 1 of FIG. 5, the first trench 400T (see FIG. 5) is not formed in the encapsulation layer 400 of the display apparatus 5. By omitting a process of forming the first trench 400T, the process of FIG. 16 may be simplified, and strength of the display apparatus 5 may be improved by making the thickness of the encapsulation layer 400 constant.

The refractive index compensation layer 300 having a refractive index greater than the refractive index of air and less than the refractive index of the encapsulation layer 400 may be located between the encapsulation layer 400 and the substrate 100, thereby improving visibility distortion of the display apparatus 5.

In the embodiments of the display apparatuses 2, 3, 4, and 5 described above, the first intermediate layer 222a, the second intermediate layer 222c, the second electrode 223, and the capping layer 230 excluding the emission layer 222b are located in both the transmission area TA and the display area DA. However, embodiments according to the present disclosure are not limited thereto. According to some embodiments, at least one of the first intermediate layer 222a, the second intermediate layer 222c, the second electrode 223, or the capping layer 230 may not be located in the transmission area TA.

Embodiments of the disclosure may prevent product price increase and a decrease in mass productivity due to an increase in process, reduce defect factors due to the generation of particles, and reduce a dead space in a transmission area. However, the effects described above are illustrative, and effects according to the embodiments will be described in detail later below.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
a substrate;
an insulating layer on the substrate and including a first opening;
a plurality of first electrodes on the insulating layer, not overlapping the first opening, and spaced apart from each other;
an emission layer on each of the plurality of first electrodes without overlapping the first opening;
an intermediate layer including the emission layer;
a second electrode on the intermediate layer;
an encapsulation layer on the second electrode and including a glass material, the encapsulation layer including a first trench formed by removing a portion of the encapsulation layer facing the first opening; and
a polarization layer on the encapsulation layer and including a second opening overlapping and extending outside the first opening, wherein
the first trench overlaps the first opening, and the second opening overlaps the first trench.

2. The display apparatus of claim 1, further comprising:
a refractive index compensation layer between the first trench and the substrate.

3. The display apparatus of claim 2, wherein a refractive index of the refractive index compensation layer is greater than a refractive index of air and less than a refractive index of the encapsulation layer.

4. The display apparatus of claim 3, wherein the refractive index compensation layer includes a silicon resin.

5. The display apparatus of claim 1, wherein the insulating layer includes multilayer films, and
the first opening is formed in at least one of the multilayer films.

6. The display apparatus of claim 1, wherein the intermediate layer includes a first intermediate layer between the emission layer and the plurality of first electrodes, and a second intermediate layer between the emission layer and the second electrode, and
at least one of the first intermediate layer or the second intermediate layer overlaps the first opening and the second opening.

7. The display apparatus of claim 1, wherein the second electrode overlaps the first opening and the second opening.

8. The display apparatus of claim 1, further comprising a capping layer between the second electrode and the encapsulation layer,
wherein the capping layer overlaps the first opening and the second opening.

9. The display apparatus of claim 1, wherein the substrate includes a second trench overlapping the first opening and the second opening.

10. The display apparatus of claim 1, further comprising:
a pixel defining layer surrounding the plurality of first electrodes; and
a spacer in a partial area on the pixel defining layer, wherein the spacer surrounds the first opening.

11. The display apparatus of claim 1, further comprising a cover layer including a transparent material on the polarization layer.

12. The display apparatus of claim 11, further comprising an adhesive layer between the polarization layer and the cover layer.

13. A display apparatus comprising:
a substrate;
an insulating layer on the substrate and including a transmission area including a first opening and a display area surrounding the transmission area;
a plurality of pixels on the insulating layer, overlapping the display area, and including an intermediate layer including a first electrode, a second electrode facing the first electrode, and an emission layer between the first electrode and the second electrode;
an encapsulation layer on the plurality of pixels and including a glass material, the encapsulation layer including a first trench formed by removing a portion of the encapsulation layer facing the first opening; and
a polarization layer on the encapsulation layer and including a second opening overlapping and extending outside the first opening,
wherein
the emission layer does not overlap the transmission area, and
the first trench overlaps the first opening, and the second opening overlaps the first trench.

14. The display apparatus of claim 13, wherein the intermediate layer includes a first intermediate layer between the emission layer and the first electrode, and a second intermediate layer between the emission layer and the second electrode, and
at least one of the first intermediate layer or the second intermediate layer is continuously located in the transmission area and the display area without interruption.

15. The display apparatus of claim 13, wherein the second electrode is continuously located in the transmission area and the display area without interruption.

16. The display apparatus of claim 13, further comprising a capping layer between the second electrode and the encapsulation layer,
wherein the capping layer is continuously located in the transmission area and the display area without interruption.

17. The display apparatus of claim 13, wherein
the display apparatus further comprising: a refractive index compensation layer between the first trench and the substrate and having a refractive index greater than that of air and less than that of the encapsulation layer.

* * * * *